(12) United States Patent
Takita

(10) Patent No.: US 7,119,877 B2
(45) Date of Patent: Oct. 10, 2006

(54) EXPOSURE APPARATUS INCLUDING A NON-CONTACT UTILITIES TRANSFER ASSEMBLY

(75) Inventor: Mark Takita, Palo Alto, CA (US)

(73) Assignee: Nikon Corporation, (JP)

( * ) Notice: Subject to any disclaimer, the term of this patent is extended or adjusted under 35 U.S.C. 154(b) by 65 days.

(21) Appl. No.: 11/000,313

(22) Filed: Nov. 30, 2004

(65) Prior Publication Data

US 2006/0114443 A1    Jun. 1, 2006

(51) Int. Cl.
*G03B 27/42* (2006.01)
(52) U.S. Cl. ............... 355/53; 355/72; 355/75; 250/492.1; 250/492.2
(58) Field of Classification Search ............ None
See application file for complete search history.

(56) References Cited

U.S. PATENT DOCUMENTS 6,954,258 B1 * 10/2005 Emoto ............... 355/72

FOREIGN PATENT DOCUMENTS

| EP | 0469744 | * | 2/1992 |
| EP | 1018669 | * | 1/1999 |
| EP | 1286221 | * | 2/2003 |
| JP | 11214482 | * | 8/1999 |
| JP | 2004-165198 | | 6/2004 |

OTHER PUBLICATIONS

U.S. Appl. No. 10/734,396, filed Dec. 12, 2003, Phillips.
U.S. Appl. No. 10/777,515, filed Feb. 11, 2004, Phillips.

* cited by examiner

*Primary Examiner*—D. Rutledge
(74) *Attorney, Agent, or Firm*—Steven G. Roeder

(57) ABSTRACT

An apparatus (10) for positioning a device (228) includes a stage assembly (218) and a first transfer device (268A). The stage assembly (218) positions the device (228) and includes a device stage (250) that retains the device (228). The stage assembly (218) positions the device (228) in a work area (238) and a transfer area (240). The transfer device (268A) transfers a first utility to or from the device stage (250) in a non-contact fashion when the device stage (250) is in the transfer area (240) and does not transfer the first utility to or from the device stage (250) when the device stage (250) is in the work area (238). The first utility can be electrical power and/or electrical signals. Additionally, the apparatus (10) can include a loader (242) that loads the device (228) onto the device stage (250) when the device stage (250) is in the transfer area (240).

24 Claims, 5 Drawing Sheets

EXPOSURE APPARATUS INCLUDING A NON-CONTACT UTILITIES TRANSFER ASSEMBLY

BACKGROUND

Lithography exposure apparatuses are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, and a measurement system that precisely monitors the position of the reticle and the wafer.

The reticle stage assembly and the wafer stage assembly require one or more utilities to function. Examples of utilities include electrical power and electrical control signals. These electrical utilities are usually transferred with electrical wires. Unfortunately, movement of the stage causes vibration of the wires that can influence the accuracy of the position of the stage. Moreover, the movement of the wires can generate particles that reduce the performance of the exposure apparatus.

SUMMARY

The present invention is directed to an apparatus that includes a stage assembly and a transfer device. The stage assembly positions a device in a work area and in a transfer area, and the stage assembly includes a device stage that retains the device. In one embodiment, the transfer device transfers a utility to or from the device stage in a non-contact fashion when the device stage is in the transfer area and does not transfer the utility to or from the device stage when the device stage is in the work area.

Additionally, the apparatus can include a loader that loads the device on the device stage when the device stage is in the transfer area. Moreover, in one embodiment, a portion of the transfer device is secured to the loader.

In one embodiment, the transfer device can include a first component that is coupled to the stage and a second component that interacts with the first component to transfer the utility between the components. The second component is positioned near to and spaced apart from the first component when the device stage is in the transfer area.

The present invention is also directed to a method for making an exposure apparatus.

DESCRIPTION

Figure 1:
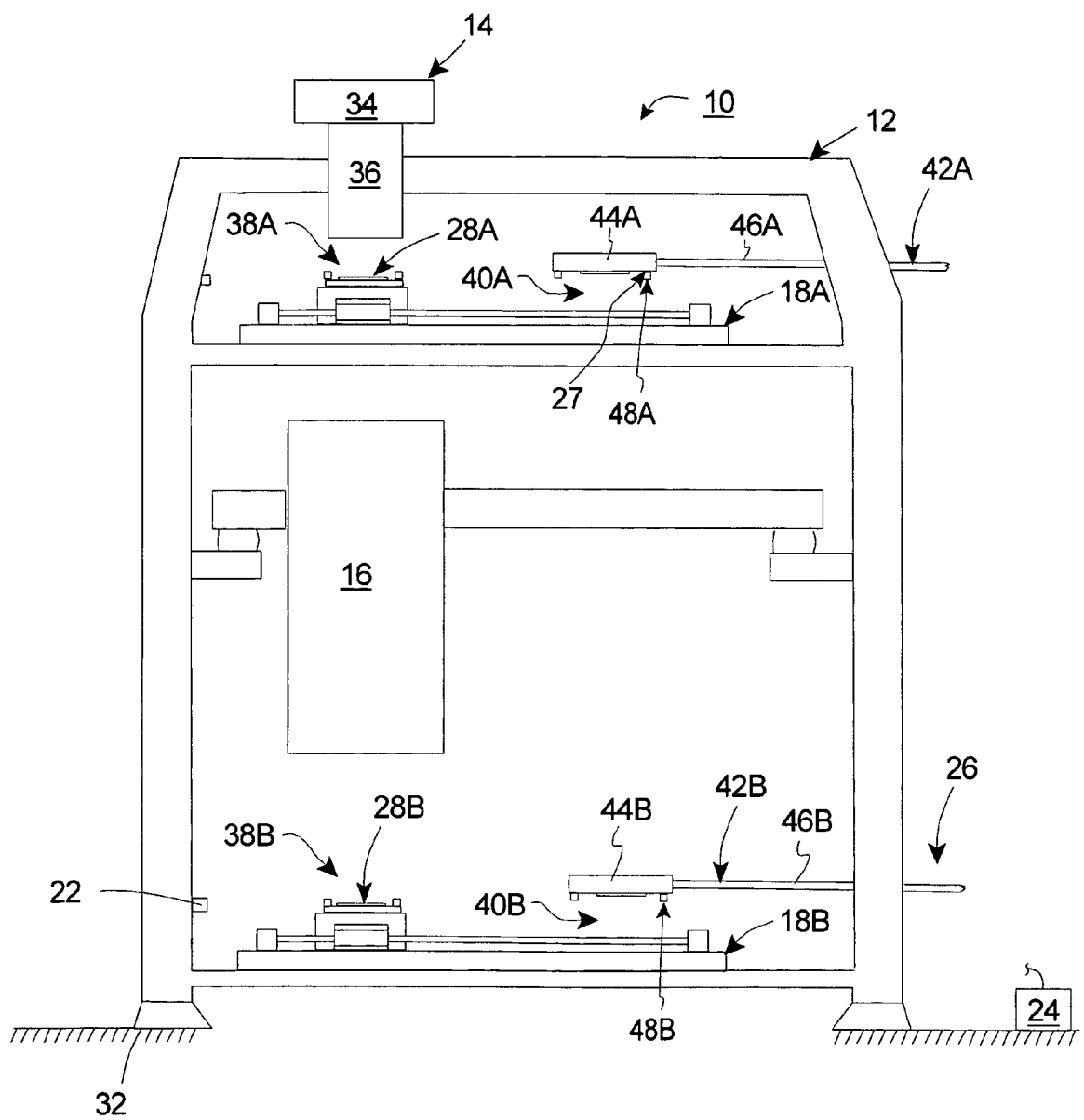
FIG. 1 is a side illustration of an exposure apparatus, having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a first stage assembly 18A, a second stage assembly 18B, a measurement system 22, a control system 24, a loader assembly 26, and a utilities transfer assembly 27. As described below, the utilities transfer assembly 27 can be used to transfer utilities to the stage assemblies 18A, 18B in a non-contact fashion.

A number of Figures include an orientation system that illustrates an X axis, a Y axis that is orthogonal to the X axis, and a Z axis that is orthogonal to the X and Y axes. It should be noted that these axes can also be referred to as the first, second and third axes.

The design of the components of the exposure apparatus 10 can be varied to suit the design requirements of the exposure apparatus 10. In one embodiment, the exposure apparatus 10 is useful as a lithographic device that transfers a pattern (not shown) of an integrated circuit from a reticle 28A onto a semiconductor wafer 28B. The reticle 28A and/or the wafer 28B are also referred to generally as a device and/or a work piece. The exposure apparatus 10 mounts to a mounting base 32, e.g., the ground, a base, or floor or some other supporting structure.

There are a number of different types of lithographic devices. In one embodiment, the exposure apparatus 10 is a scanning type photolithography system that exposes a pattern from the reticle 28A onto the wafer 28B with the reticle 28A and the wafer 28B moving synchronously. In a scanning type lithographic apparatus, the reticle 28A is moved perpendicularly to an optical axis of the optical assembly 16 by the reticle stage assembly 18A and the wafer 28B is moved perpendicularly to the optical axis of the optical assembly 16 by the wafer stage assembly 18B. Scanning of the reticle 28A and the wafer 28B occurs while the reticle 28A and the wafer 28B are moving synchronously.

Alternatively, the exposure apparatus 10 can be a step-and-repeat type photolithography system that exposes the reticle 28A while the reticle 28A and the wafer 28B are stationary. In the step and repeat process, the wafer 28B is in a constant position relative to the reticle 28A and the optical assembly 16 during the exposure of an individual field. Subsequently, between consecutive exposure steps, the wafer 28B is consecutively moved with the wafer stage assembly 18B perpendicularly to the optical axis of the optical assembly 16 so that the next field of the wafer 28B is brought into position relative to the optical assembly 16 and the reticle 28A for exposure. Following this process, the images on the reticle 28A are sequentially exposed onto the fields of the wafer 28B, and then the next field of the wafer 28B is brought into position relative to the optical assembly 16 and the reticle 28A.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. In addition to a photolithography system, the exposure apparatus 10 may be a charged particle lithography system such as an electron beam or ion beam lithography system.

The apparatus frame 12 supports some of the components of the exposure apparatus 10. The apparatus frame 12 illustrated in FIG. 1 supports the stage assemblies 18A, 18B, the optical assembly 16, and the illumination system 14 above the mounting base 32.

The illumination system 14 includes an illumination source 34 and an illumination optical assembly 36. The illumination source 34 emits a beam (irradiation) of light energy. The illumination optical assembly 36 guides the beam of light energy from the illumination source 34 to the reticle 28A. The beam illuminates selectively different portions of the reticle 28A and exposes the wafer 28B. In FIG. 1, the illumination system 14 is illustrated as being supported above the reticle stage assembly 18. In this embodiment, the energy beam from the illumination system 14 is directed towards the reticle 28A downward to the optical assembly 16. Alternatively, for example, the illumination system 14 can be positioned elsewhere.

The illumination source 34 can be a g-line source (436 nm), an i-line source (365 nm), a KrF excimer laser (248 nm), an ArF excimer laser (193 nm) or a $F_2$ laser (157 nm). Alternatively, the illumination source 34 can generate charged particle beams such as an electron beam. Furthermore, in the case where an electron beam is used, the structure could be such that either a mask is used or a pattern can be directly formed on a substrate without the use of a mask.

The optical assembly 16 projects and/or focuses the light from the reticle 28A to the wafer 28B. Depending upon the design of the exposure apparatus 10, the optical assembly 16 can magnify or reduce the image illuminated on the reticle 28A.

When deep ultra-violet radiation such as produced by an excimer laser is used, glass materials such as quartz and fluorite that transmit far ultra-violet rays can be used in the optical assembly 16. When an electron beam is used, electron optics can consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The first stage assembly 18A holds the reticle 28A and positions the reticle 28A relative to the optical assembly 16 and the wafer 28B. In one embodiment, the first stage assembly 18A moves the reticle 28A in a first work area 38A and in a first transfer area 40A. In the first work area 38A, the energy beam is directed at the reticle 28A and the reticle 28A is positioned above the optical assembly 16. In the first transfer area 40A one or more utilities can be transferred to and from the first stage assembly 18A, the energy beam is not directed at the reticle 28A, and/or the reticle 28A is positioned away from the optical assembly 16.

Somewhat similarly, the second stage assembly 18B holds and positions the wafer 28B with respect to the projected image of the illuminated portions of the reticle 28A. In one embodiment, the second stage assembly 18B moves the wafer 28B in a second work area 38B and in a second transfer area 40B. In the second work area 38B, the projected image is directed at the wafer 28B, and the wafer 28B is positioned below the optical assembly 16. In the second transfer area 40B, one or more utilities can be transferred to and from the second stage assembly 18B, the projected image is not directed at the wafer 28B, and/or the wafer 28B is positioned away from the optical assembly 16.

In photolithography systems, when linear motors (see U.S. Pat. Nos. 5,623,853 or 5,528,118) are used in the first stage assembly 18A or the second stage assembly 18A, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Moreover, one or more chambers (not shown) can encircle and enclose one or both of the stage assemblies 18A, 18B. The chambers facilitate the creation of a controlled environment around the respective device. The desired environment created and/or controlled in the chambers can be selected according to the design of the rest of the components of the exposure apparatus 10, including the illumination system 14. For example, the desired controlled environment can be a vacuum type environment or, the controlled environment can be an inert gas, such as Argon, Helium, or Nitrogen, or another type of fluid.

Alternatively, for example, one or both of the stage assemblies 18A, 18B can be designed without the respective chamber.

The measurement system 22 monitors movement of the reticle 28A and the wafer 28B relative to the optical assembly 16 or some other reference. With this information, the control system 24 can control the first stage assembly 18A to precisely position the reticle 28A and the second stage assembly 18B to precisely position the wafer 28B. The design of the measurement system 22 can vary. For example, the measurement system 22 can utilize multiple laser interferometers, encoders, mirrors, and/or other measuring device.

The control system 24 is electrically connected to the measurement system 22, and the stage assemblies 18A, 18B. In one embodiment, the control system 24 receives information from the measurement system 22 and controls the stage assemblies 18A, 18B to precisely position the reticle 28A and the wafer 28B. The control system 24 can also be electrically connected to the utilities transfer assembly 27. The control system 24 can include one or more systems, processors and circuits.

The loader assembly 26 loads reticles 28A on the first stage assembly 18A, removes the reticles 28A from the first stage assembly 18A, loads wafers 28B on the second stage assembly 18B, and/or removes the wafers 28B from the second stage assembly 18B. In the embodiment illustrated in FIG. 1, the loader assembly 26 includes (i) a first loader 42A that includes a first loader stage 44A that selectively retains the reticle 28A, and a first robotic arm 46A that moves and positions the first loader stage 44A, and (ii) a second loader 42B that includes a second loader stage 44B that selectively retains the wafer 28B, and a second robotic arm 46B that moves and positions the second loader stage 44B. In alternative embodiments, each robotic arm 46A, 46B can be designed to move the respective loader stage 44A, 44B with one, two, three, four, five or six degrees of freedom.

The utilities transfer assembly 27 transfers one or more utilities to and/or from the first stage assembly 18A and/or the second stage assembly 18B. In FIG. 1, the utilities transfer assembly 27 includes a first transfer assembly 48A for transferring one or more utilities to and/or from the first stage assembly 18A and a second transfer assembly 48B for transferring one or more utilities to and/or from the second stage assembly 18B. Alternatively, for example, the exposure apparatus 10 can be designed without one of the transfer assemblies 48A, 48B.

Figure 2A:
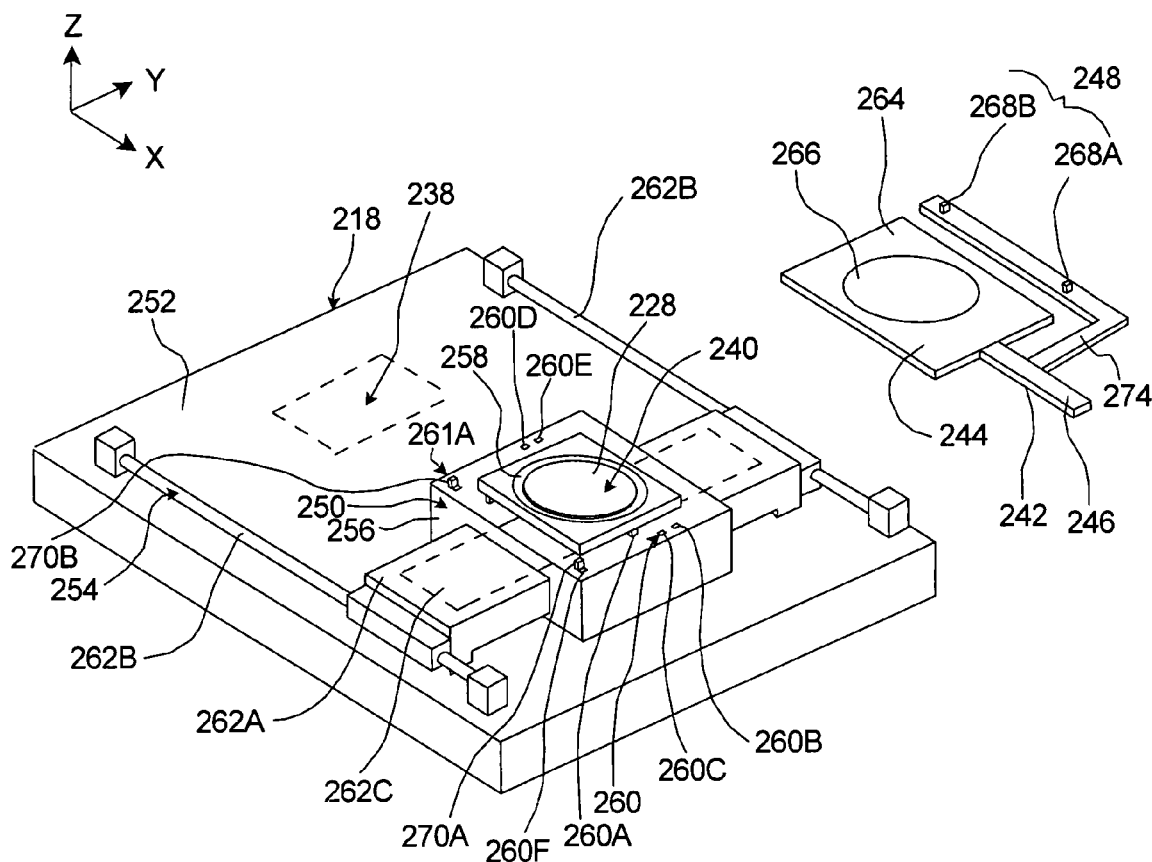
FIG. 2A is a simplified perspective view of a stage assembly, a portion of a loader, and a transfer assembly having features of the present invention.

FIG. 2A is a simplified, detailed, perspective view of a stage assembly 218, a portion of a loader 242, and a transfer assembly 248. The design of each of these components can be varied to suit the design requirements of the exposure apparatus 10 (illustrated in FIG. 1). It should be understood that the transfer techniques of the present invention can be implemented in stage assemblies have other configurations. Further, it should be noted in FIG. 2A that the loader stage 244 has been rotated 180 degrees about the X axis to better illustrate some of the features of the present invention.

The stage assembly 218 moves and positions the device 228. In alternative embodiments, the stage assembly 218 can be designed to move the device 228 with one, two, three, four, five or six degrees of freedom. The stage assembly 218 can be used as the first stage assembly 18A or the second stage assembly 18B described above and illustrated in FIG. 1. Alternatively, the stage assembly 218 can be used to move other types of devices during manufacturing and/or inspection, to move a device under an electron microscope (not shown), or to move a device during a precision measurement operation (not shown).

In one embodiment, the stage assembly 218 includes (i) a device stage 250 that retains the device 228, (ii) a stage base 252 that supports and guides the movement of the device stage 250, and (iii) a stage mover assembly 254 that moves and positions the device stage 250 and the device 228.

The device stage 250 includes stage body 256, a chuck 258 that retains the device 228, and one or more electronic components 260 (illustrated as boxes). The chuck 258 can be a vacuum chuck, an electrostatic chuck, or some other type of chuck. The number and type of electronic components 260 positioned on the device stage 250 can vary. As non-exclusive examples, one or more of the electronic components 260 can include one or more motors, processors, control amplifiers, drivers, actuators, sensors, control circuitry, and/or utilities storage devices.

Further, one or more of the electronic components 260 can require one or more electrical utilities to operate properly. For example, one or more of the electronic components 260 can require electrical power or electronic control signals to operate. Alternatively, one or more of the electronic components 260 can generate an electrical utility. For example, one or more of the electronic components 260 can generate or collect data and/or information.

In the embodiment illustrated in FIG. 2A, the electronic components 260 on the device stage 250 include a chuck mover assembly 260A, a sensor 260B, a first utilities storage device 260C, a second utilities storage device 260D, a control circuitry 260E, and a component mover assembly 260F. Alternatively, the device stage 250 can be design to have fewer or more electronic components 260.

In FIG. 2A, the chuck mover assembly 260A moves and adjusts the position of the chuck 258 relative to the stage body 256. For example, the chuck mover assembly 260A can finely adjust the position of the chuck 258 and the device 228 with one to six degrees of freedom. In one embodiment, the chuck mover assembly 260A lifts the chuck 258 along the Z axis to facilitate loading and unloading of the device 228. The chuck mover assembly 260A can include one or more linear motors, rotary motors, voice coil motors, electromagnetic movers, planar motors, or some other force movers.

The sensor 260B can generate or collect data and/or information. Non-exclusive examples of sensors 260B include opto-couplers, infrared xmit/RCVs, coil pairs, and antenna pairs.

The utilities storage devices 260C, 260D can store electrical power or electrical signals. As an example, one or both of the utilities storage devices 260C, 260D (i) can store electrical power and can include one or more rechargeable batteries, capacitors, ultra-capacitors, high density capacitors such as aerogel, and/or (ii) can store electrical data and can include flash memory, RAM or another type of digital memory device.

The control circuitry 260E can collect information and control the operation of one or more of the other electronic components 260. The control circuitry 260E can include one or more processors.

The component mover assembly 260F moves a portion of the transfer assembly 248 relative to the device stage 250. In one embodiment, the component mover assembly 260F moves a portion of the transfer assembly 248 between an extended position 261A in which the transfer assembly 248 extends away from the device stage 250 and a retracted position 261B (illustrated in FIG. 2C) in which at least a portion of the transfer assembly 248 is retracted into the device stage 250. The component mover assembly 260F can include one or more linear motors, rotary motors, voice coil motors, electromagnetic movers, planar motors, or some other force movers.

The stage mover assembly 254 moves the device stage 250 and the device 228. In FIG. 2A, the stage mover assembly 254 moves the device stage 250 with three degrees of freedom, namely along the X axis, along the Y axis and about the Z axis. In this embodiment, the stage mover assembly 254 includes (i) a guide bar 262A that guides the motion of the device stage 250 along the Y axis, (ii) a pair of X movers 262B that move the guide bar 262A and the device stage 250 along the X axis and about the Z axis, and (iii) a Y mover 262C (illustrated in phantom) that moves the device stage 250 along the Y axis. Each mover 262B, 262C can be a linear motor. Alternatively, for example, the stage mover assembly 254 can be designed to include one or more rotary motors, voice coil motors, electromagnetic movers, planar motor, or some other force movers.

In FIG. 2A, a bearing (not shown) maintains the device stage 250 spaced apart along the Y and Z axes relative to the guide bar 262A and allows for motion of the device stage 250 along the Y axis. Further, a bearing (not shown) maintains the device stage 250 spaced apart along the Z axis relative to the stage base 252 and allows for motion of the device stage 250 along the X and Y axes, and about the Z axis. In one embodiment, the bearing is a fluid type bearing.

In FIG. 2A, the stage mover assembly 254 moves the device stage 250 between the work area 238 (illustrated as a box in phantom) and the transfer area 240. The location of the transfer area 240 can vary. In FIG. 2A, the transfer area 240 is located where the loader 242 can add the device 228 to the device stage 250 or remove the device 228 from the device stage 250. Alternatively, for example, the transfer area 240 can be another area that is outside the work area 238. For example, the transfer area 240 can be at or near the location where alignment of the device 228 occurs.

The loader stage 244 includes a loader stage body 264 and a loader chuck 266 that selectively retains the device 228. The loader chuck 266 can be a vacuum chuck, an electrostatic chuck, or some other type of chuck.

The robotic arm 246 positions the loader stage 244 adjacent to the device stage 250 during the transfer of the device 228 between the loader stage 244 and the device stage 250. In FIG. 2A, loader stage 244 has been rotated away from the device stage 250.

The transfer assembly 248 transfers one or more utilities to and/or from the electronic components 260 on the device stage 250 when the device stage 250 is in the transfer area 240. In one embodiment, the transfer assembly 248 transfers the utilities in a non-contact fashion. Non-contact utilities transfer refers to the transfer of utilities where the transfer assembly 248 applies substantially zero net force on the stage 250 during the transfer. This reduces disturbances to the device stage 250, and reduces particle generation from moving or contacting transfer components. Transfer can occur while the device 228 is loaded to the device stage 250, and the device stage 250 is stationary.

In FIG. 2A, the transfer assembly 248 includes a first transfer device 268A that is used to transfer a first utility, and a second transfer device 268B that is used to transfer a second utility. Alternatively, for example, the transfer assembly 248 can be designed with less than two or more than two transfer devices 268A, 268B.

In one embodiment, each transfer device 268A, 268B transfers a different type or level of utility. For example, the first utility can be electrical power at a first voltage level and the second utility can be electrical power at a second voltage level that is different than the first voltage level. Alternatively, the first utility can be electrical power at a first voltage level and the second utility can be an electrical signal. Still alternatively, for example, the first utility can be a first electrical signal and the second utility can be a second electrical signal that is different than the first electrical signal.

The design of each transfer device 268A, 268B can be varied according to the type of utilities being transferred. In FIG. 2A, each transfer device 268A, 268B includes a first component 270A and a second component 270B that interacts with the first component 270A to transfer the utility. In this embodiment, for each transfer device 268A, 268B, the first component 270A is secured to the stage assembly 218, e.g. the device stage 250, and the second component 270B is positioned adjacent to and spaced apart a gap 272 (illustrated in FIG. 2B) from the first component 270B when the device stage 250 is in the transfer area 240. The size of the gap 272 can be varied to suit the type and level of utilities being transferred. In alternative, non-exclusive embodiment, during a utilities transfer, the gap 272 between the components 270A, 270B for each utilities transfer device 268A, 268B is less than approximately 0.5, 1, 1.5, 2, 2.5, 3, 4, 5, or 6 millimeters. However, the gap 272 can be greater than these amounts. Generally speaking, the efficiency of the utilities transfer increases as the size of the gap 272 decreases. In one embodiment, the device stage 250 is stationary during the transfer of the utilities.

In one embodiment, the transfer assembly 248 includes a transfer frame 274 that supports the second component 270B of each transfer device 268A, 268B. In FIG. 2A, the transfer frame 274 is secured to the robotic arm 246 of the loader 242. With this design, the robotic arm 246 can be used to position the second component 270B of each transfer device 268A, 268B adjacent to and aligned with the respective first component 270A when the device stage 250 is in the transfer area 240. Further, with this design, in certain embodiments, the utilities can be transferred at approximately the same time that the device 228 is transferred between the loader 242 and the device stage 250. Alternatively, for example, the second component 270B of one or both of the transfer devices 268A, 268B can be secured directly to the loader stage 244 or to another structure that is adjacent to and spaced apart the gap 272 from the first component 270B when the device stage 250 is in the transfer area 240.

It should be noted that when the device stage 250 is positioned out of the transfer area 240, e.g. in the work area 238, the second component 270B of each of the utilities transfer devices 268A, 268B is spaced apart a relatively large distance from the respective first component 270A and the device stage 250. In alternative non-exclusive embodiments, the distance is at least approximately 2, 10, 20, 50 or 100 times greater than the gap 272. As a result thereof, in certain embodiments, utilities can not be transferred by the transfer devices 268A, 268B when the device stage 250 is out of the transfer area 240.

In FIG. 2A, the first transfer device 268A is a transformer type arrangement that transfers electrical power between the device stage 250 and the loader 242 in a non-contact fashion. In one embodiment, for the first transfer device 268A, one of the components 270A, 270B is an inductive, primary coil and the other component 270B, 270A is an inductive, secondary coil. With this design, current through the primary coil creates an electromagnetic field that causes current to flow within the secondary coil. For example, if the electronic components 260 on the device stage 250 require electrical power, the second component 270B can be the primary coil and the first component 270A can be the secondary coil and electrical power can be transferred to the electronic components 260. In alternative, non-exclusive embodiments, voltages of approximately 70, 80, 90, 100, 120, 140, 200 mA are transferred. However, greater or lesser voltages can be transferred.

With this design, for example, the first transfer device 268A can be used to transfer electrical power to power the chuck mover assembly 260A, the sensor 260B, the control circuitry 260E, and/or the component mover assembly 260F. Further, for example, electrical power can be stored in the first utilities storage device 260C for subsequent usage.

Further, in FIG. 2A, the second transfer device 268B transfers electrical signals (e.g. information and/or data) between the electronic components 260 on the device stage 250 and the control system 24 (illustrated in FIG. 1) via the loader 242 in a non-contact fashion. As non-exclusive examples, the second transfer device 268B can be a photocoupler, an infra-red transmitter, a radio frequency transmitter, an optical transmitter, and/or a radiation transmitter.

With this design, for example, the second transfer device 268B can be used (i) to transfer electrical signals from the control system 24 to the electrical components 260, e.g. the sensor 260B or the control circuitry 260E, to control one or more electrical components 260 on the device stage 250, and/or (ii) to transfer electrical signals from the electrical components 260, e.g. the sensor 260B or the control circuitry 260E to the control system 24. For example, the electrical signals transferred to the device stage 250 can be instructions that are used to control one or more electronic components 260 on the device stage 250 and the electrical signals transferred from the device stage 250 can provide data/information from one or more sensors 260B on the device stage 250.

Additionally, electrical signals can be stored in the second utilities storage device 260D for subsequent usage or transfer.

Figure 2B:
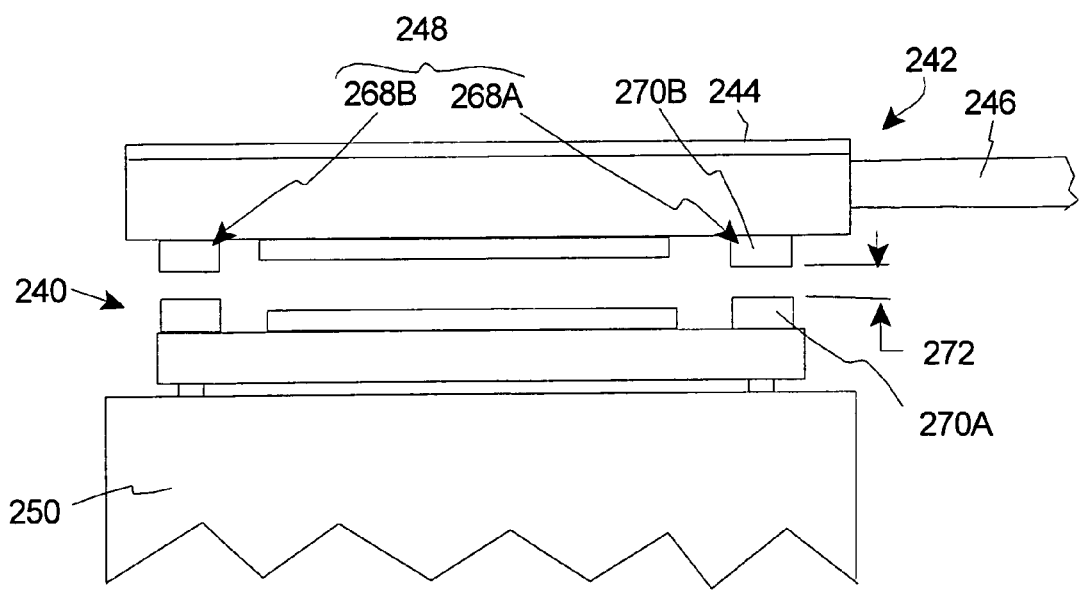
FIG. 2B is a simplified side view of a portion of the stage assembly, the loader, and the transfer assembly of FIG. 2A.

FIG. 2B is a side view of a portion of the device stage 250, a portion of a loader 242, and the transfer assembly 248. In FIG. 2B, the device stage 250 is in the transfer area 240 and the robotic arm 246 has moved the loader stage to be adjacent to the device stage 250. In this position, for each transfer device 268A, 268B, the first component 270A is positioned adjacent to and spaced apart the gap 272 from the second component 270B.

Figure 2C:
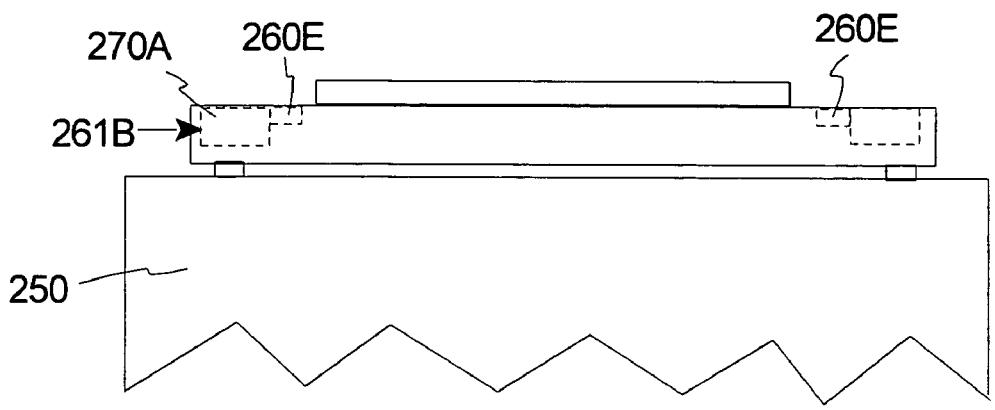
FIG. 2C is a simplified side view of a portion of the stage assembly and a portion of the transfer assembly.

FIG. 2C is a side view of a portion of the device stage 250. In FIG. 2C, the component mover assembly 260E has moved the first components 270A (illustrated in phantom) into the retracted position 261B. In this position, the first components 270A will not interfere with the other operations of the apparatus 10 (illustrated in FIG. 1).

Figure 3:
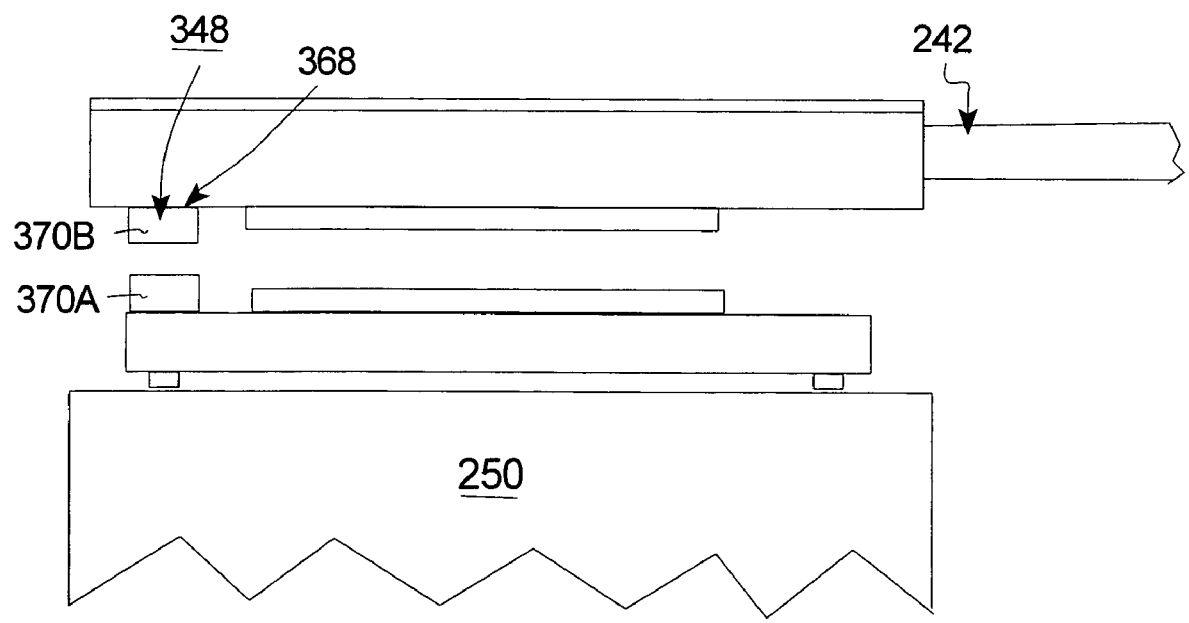
FIG. 3 is a simplified side view of a portion of the stage assembly, the loader, and another embodiment of the transfer assembly.

FIG. 3 is a side view of portion of the device stage 250, a portion of a loader 242, and another embodiment of the transfer assembly 348. In FIG. 3, the transfer assembly 348 includes a single transfer device 368 that is used to transfer multiple utilities.

In one embodiment, the utilities transfer device 368 transfers at least two different types or levels of utility. For example, the transfer device 368 can transfer electrical power at a first voltage level and at a second voltage level that is different than the first voltage level. Alternatively, the transfer device 368 can transfer electrical power and an electrical signal. Still alternatively, for example, the transfer device 368 can transfer a first electrical signal and a second electrical signal that is different than the first electrical signal.

In one embodiment, the transfer device 368 is a transformer type arrangement that transfers electrical power and an electrical signal between the device stage 250 and the loader 242 in a non-contact fashion. In one embodiment, for the utilities transfer device 368, one of the components 370A, 370B is an inductive, primary coil and the other component 370B, 370C is an inductive, secondary coil. With this design, current through the primary coil creates an electromagnetic field that causes current to flow within the secondary coil. Moreover, low level signals can be transferred with this arrangement.

Figure 4A:
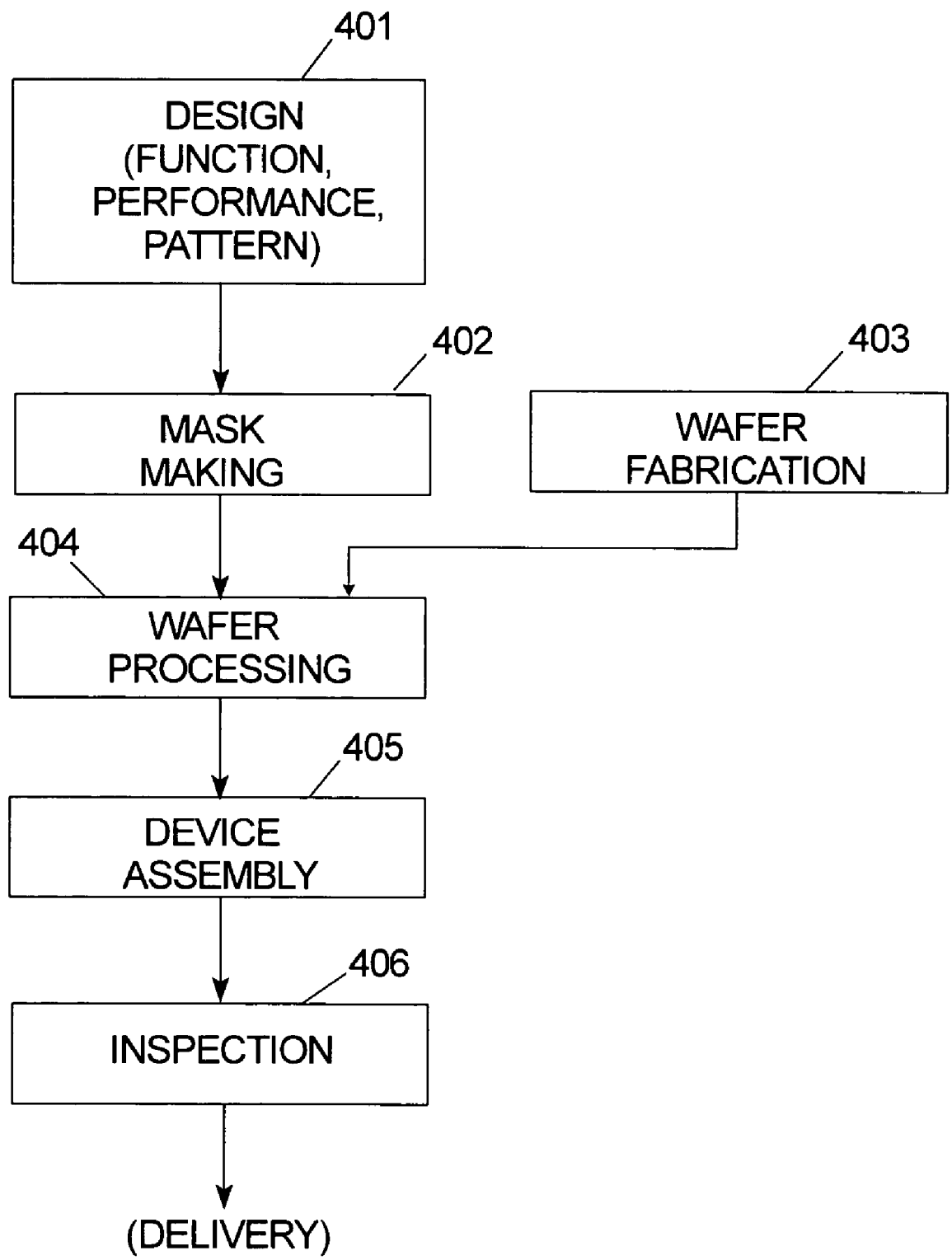
FIG. 4A is a flow chart that outlines a process for manufacturing a device in accordance with the present invention.

Semiconductor devices can be fabricated using the above described systems, by the process shown generally in FIG. 4A. In step 401 the device's function and performance characteristics are designed. Next, in step 402, a mask (reticle) having a pattern is designed according to the previous designing step, and in a parallel step 403 a wafer is made from a silicon material. The mask pattern designed in step 402 is exposed onto the wafer from step 403 in step 404 by a photolithography system described hereinabove in accordance with the present invention. In step 405 the semiconductor device is assembled (including the dicing process, bonding process and packaging process), finally, the device is then inspected in step 406.

Figure 4B:
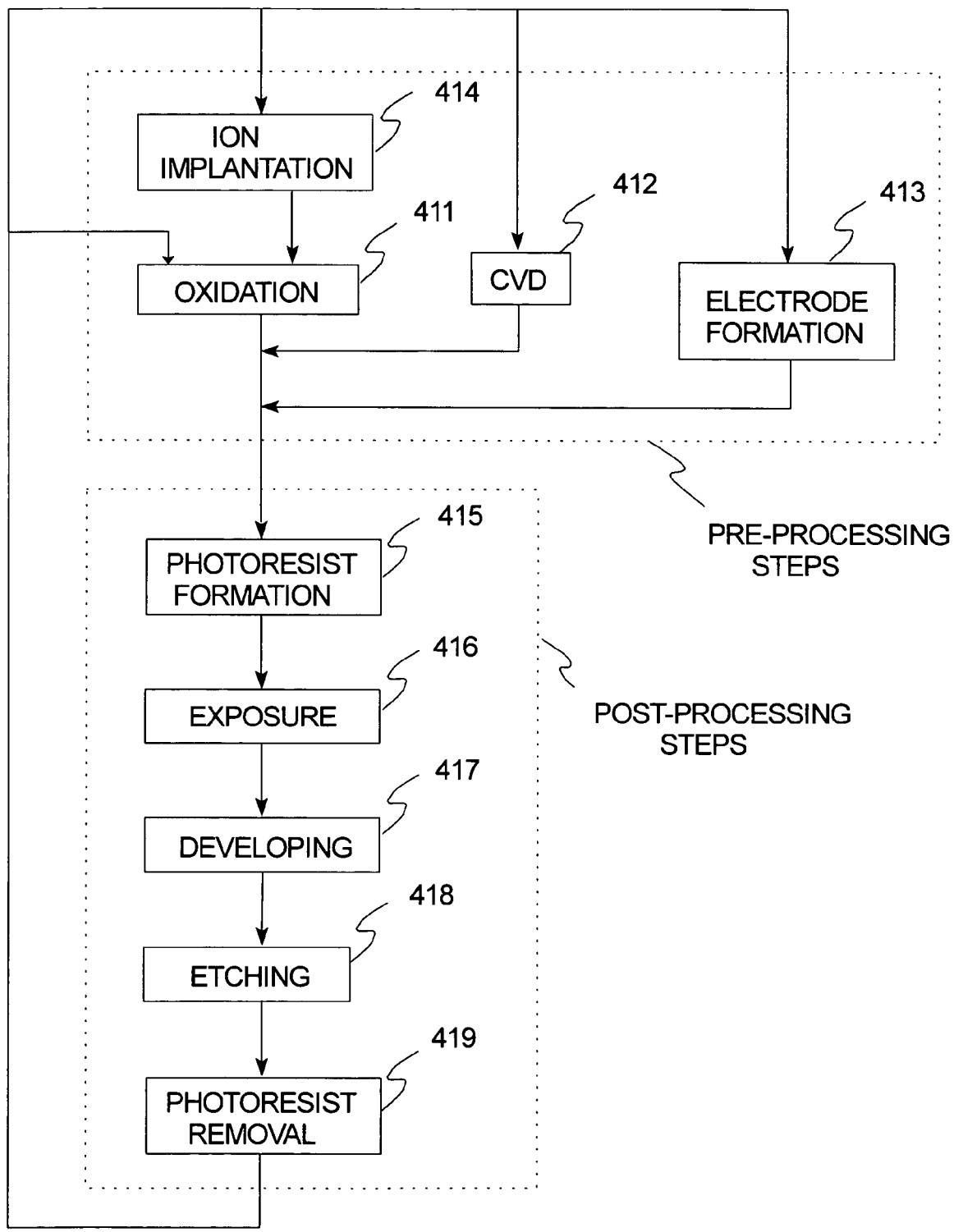
FIG. 4B is a flow chart that outlines device processing in more detail.

FIG. 4B illustrates a detailed flowchart example of the above-mentioned step 404 in the case of fabricating semiconductor devices. In FIG. 4B, in step 411 (oxidation step), the wafer surface is oxidized. In step 412 (CVD step), an insulation film is formed on the wafer surface. In step 413 (electrode formation step), electrodes are formed on the wafer by vapor deposition. In step 414 (ion implantation step), ions are implanted in the wafer. The above mentioned steps 411–414 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 415 (photoresist formation step), photoresist is applied to a wafer. Next, in step 416 (exposure step), the above-mentioned exposure device is used to transfer the circuit pattern of a mask (reticle) to a wafer. Then in step 417 (developing step), the exposed wafer is developed, and in step 418 (etching step), parts other than residual photoresist (exposed material surface) are removed by etching. In step 419 (photoresist removal step), unnecessary photoresist remaining after etching is removed.

Multiple circuit patterns are formed by repetition of these preprocessing and post-processing steps.

While the particular exposure apparatus 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An apparatus for positioning a device, the apparatus comprising:
   a stage assembly that positions the device in a work area and in a transfer area, the stage assembly including a device stage that retains the device; and
   a first transfer device that transfers a first utility to or from the device stage in a non-contact fashion when the device stage is in the transfer area and that does not transfer the first utility to or from the device stage when the device stage is in the work area.

2. The apparatus of claim 1 wherein the first transfer device transfers electrical power.

3. The apparatus of claim 1 wherein the first transfer device transfers electrical signals.

4. The apparatus of claim 1 further comprising a loader that loads a device onto the device stage and wherein a portion of the first transfer device is secured to the loader.

5. The apparatus of claim 4 wherein the loader loads the device onto the device stage when the device stage is in the transfer area.

6. The apparatus of claim 1 wherein the first transfer device includes a first component that is coupled to the stage and a second component that interacts with the first component to transfer the utility between the components, the second component being positioned near to and spaced apart a gap from the first component when the device stage is in the transfer area, and the second component is positioned a distance greater than the gap away from the first component when the device stage is in the work area.

7. The apparatus of claim 6 wherein the second component is spaced apart from the stage assembly.

8. The apparatus of claim 1 further comprising a second transfer device that transfers a second utility to or from the device stage in a non-contact fashion when the device stage is in the transfer area and that does not transfer the second utility to or from the device stage when the device stage is in the work area.

9. The apparatus of claim 8 wherein the first utility is electrical power and the second utility is an electrical signal.

10. The apparatus of claim 1 wherein the first component is at least partly, retractable within the device stage.

11. The apparatus of claim 1 wherein the first transfer device transfers a second utility that is different than the first utility.

12. The apparatus of claim 1 further comprising an illumination system that directs an energy beam at the device when the device is in the work area.

13. An apparatus for positioning a device, the apparatus comprising:
a stage assembly for positioning a device in a work area and a transfer area, the stage assembly including a device stage that retains the device;
a loader for loading a device onto the device stage; and
a transfer device for transferring a first utility between the device stage and the loader.

14. The apparatus of claim 13 wherein the loader loads the device onto the device stage when the device stage is in the transfer area.

15. The apparatus of claim 13 wherein the transfer device transfers electrical power.

16. The apparatus of claim 13 wherein the transfer device transfers electrical signals.

17. The apparatus of claim 13 wherein a portion of the transfer device is secured to the loader.

18. The apparatus of claim 13 wherein the transfer device includes a first component that is coupled to the stage and a second component that is coupled to the loader, the second component interacting with the first component to transfer the utility between the components, the second component being positioned near to and spaced apart a gap from the first component when the device stage is in the transfer area, and the second component is positioned a distance greater than the gap away from the first component when the device stage is in the work area.

19. The apparatus of claim 18 wherein the first component is at least partly, retractable within the device stage.

20. The apparatus of claim 13 further comprising an illumination system that directs an energy beam at the device when the device is in the processing area.

21. A method for positioning a device, the method comprising the steps of:
positioning the device in a work area and in a transfer area with a stage assembly, the stage assembly including a device stage that retains the device;
loading the device onto the device stage with a loader; and
transferring a utility in a non-contact fashion between the loader and the device stage with a transfer device.

22. The method of claim 21 wherein the step of transferring occurs only when the device stage is in the transfer area.

23. The method of claim 22 wherein the step of loading occurs only when the device stage is in the transfer area.

24. The method of claim 21 wherein the step of transferring includes the steps of coupling a first component to the stage, coupling a second component to the loader, the second component interacting with the first component to transfer the utility between the components, the second component being positioned near to and spaced apart a gap from the first component when the device stage is in the transfer area, and the second component is positioned a distance greater than the gap away from the first component when the device stage is in the work area.

* * * * *